United States Patent

Stengel et al.

[11] Patent Number: 5,615,096
[45] Date of Patent: Mar. 25, 1997

[54] DIRECT CURRENT POWER SUPPLY CONDITIONING CIRCUIT

[75] Inventors: Robert E. Stengel, Pompano Beach; David E. Bockelman, Plantation, both of Fla.

[73] Assignee: Motorola, Inc., Schaumburg, Ill.

[21] Appl. No.: 254,733

[22] Filed: Jun. 6, 1994

[51] Int. Cl.$^6$ .................................................. H01L 17/00
[52] U.S. Cl. .................................................. 363/60
[58] Field of Search ................................. 257/595, 310, 257/532, 533, 531; 333/184, 174, 185

[56] References Cited

U.S. PATENT DOCUMENTS 5,173,835  12/1992  Cornett et al. ........................... 257/310
5,283,462   4/1994  Stengel .................................... 257/595

Primary Examiner—Aditya Krishnan
Attorney, Agent, or Firm—M. Mansour Ghomeshi

[57] ABSTRACT

A power supply (200) includes a VVC (222) which provides for the efficient conversion of voltages with minimum ripple. The doping of the VVC (222) is altered such that most of the energy is delivered to a load (224) at a substantially constant voltage. The VVC (222) is fabricated using such materials as Zirconium Titanate. The VVC (222) has a high capacitance to volume ratio and therefore results in a significant reduction in the overall size of the power supply (200).

14 Claims, 3 Drawing Sheets

DIRECT CURRENT POWER SUPPLY CONDITIONING CIRCUIT

TECHNICAL FIELD

This invention relates generally to power supply circuits and more particularly to power supply conditioning circuits for reducing voltage variation.

BACKGROUND

Most of the power sources used in today's portable electronic equipment are voltage sources such as batteries. Batteries provide most of their stored energy at a relative constant voltage. The important characteristic of a battery source is that the terminal voltage remains within a 20% window over 95% of the capacity discharge of the cell. Thus, almost all of the stored energy in a battery can be used at a relatively constant voltage.

A constant voltage, however, includes a ripple voltage. A ripple voltage is some amount of voltage variation about a steady voltage output value. Fixed value capacitors are typically used to reduce ripple voltage. The amount of ripple voltage is a function of stored energy discharged from a capacitor by the load impedance. To obtain the lowest ripple voltage the value of the capacitance is chosen as a maximum value practical for the application. However, the amount of energy or power consumed to get the desired operating level of voltage increases with the value of capacitance in other words, the larger the capacitance the longer delay in turn on cycle and the higher the power consumption. In addition, fixed value capacitors demonstrate a linear response in delivering their energy versus voltage drop. As can be seen in FIG. 1, the supply voltage of a fixed value capacitor declines linearly as the charge is removed therefrom. Therefore, as an energy transfer or voltage source, a fixed value capacitor has a significant percentage of energy which is unusable by the load due to the decrease in the supply voltage.

It is therefore desired to have a power supply with minimum ripple and without the detriments of the fixed value capacitors of the prior art.

DETAILED DESCRIPTION OF THE PREFERRED EMBODIMENT

Figure 1:
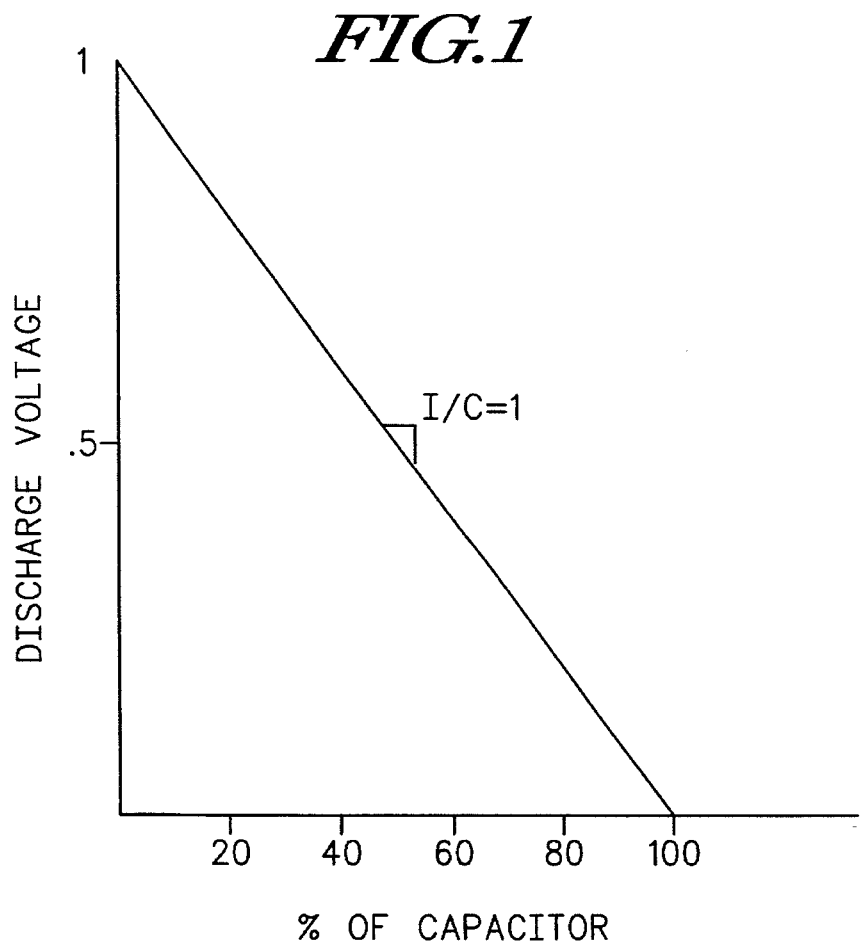
FIG. 1 shows the linear performance of a fixed value capacitor.

While the specification concludes with claims defining the features of the invention that are regarded as novel, it is believed that the invention will be better understood from a consideration of the following description in conjunction with the drawing figures, in which like reference numerals are carried forward.

Figure 2:
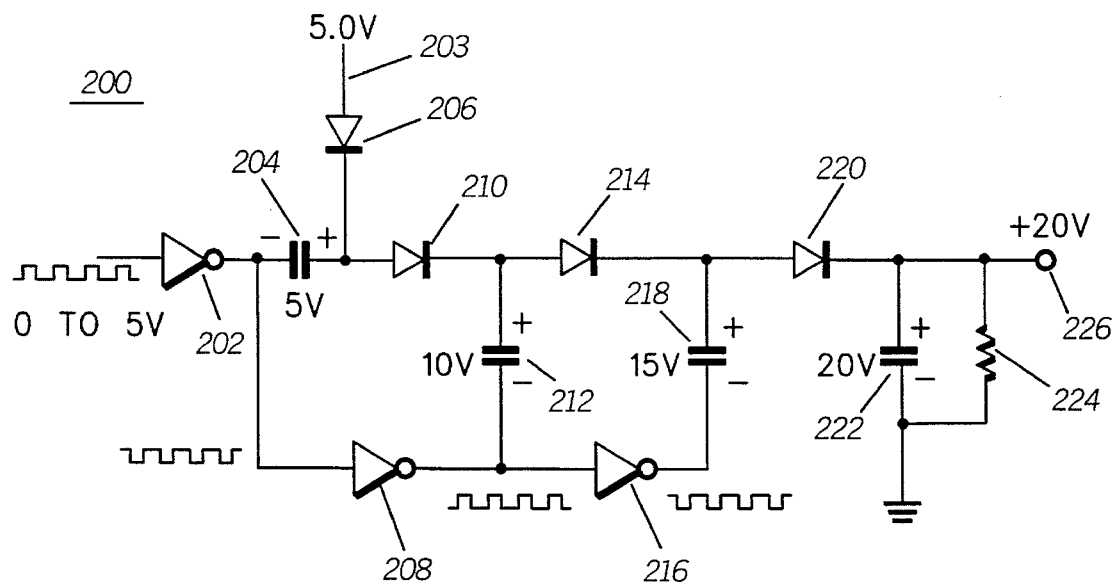
FIG. 2 shows a power supply in accordance with the present invention.

FIG. 2 shows the elements of an energy supplying device 200, in accordance with the invention. In the preferred embodiment, the device 200 is a DC to DC converter that utilizes both energy transfer and voltage source functions of the VVC 300. Energy is transferred from a lower battery voltage 203 to a higher voltage source at 226 using intermediate storage devices for temporary storage of energy. In simple terms, a first VVC 204 is connected at its positive terminal to an input voltage source, battery 203 and its negative terminal is connected to the output of inverter 202. The first VVC 204 is charged up to a first voltage (5 volts) from the first voltage source 203 during a high clock cycle applied to the input of inverter 202. The positive terminal of 204 is coupled to the positive terminal of a second VVC 212 via a diode 210. The combination of the diode 210 and a high (5 volt) at the output of inverter 202 provides for the voltage of the first VVC to be discharged into the second VVC 212 at two times the first voltage or 10 volts. The process is repeated on the second VVC 212 by connecting its negative terminal to the output of inverter 208. This inverter along with a diode 214 provides for the discharging of the second VVC 212 into a third VVC 218 at three times the voltage or 15 volts potentially. Finally the third VVC's 218 negative terminal is connected to the output of inverter 216 and discharged into a fourth VVC 222 through diode 220 at 4 times the voltage or 20 volts. The energy transfer is now completed to the voltage source or fourth VVC 222 where it is available to a load 224.

Although the preferred embodiment is shown to include VVCs for capacitors 204, 212, 218 and 222 it is noted that only the fourth storage component 222 need be a VVC. All earlier capacitors may be fixed valuable capacitors such as those available at any electronic shop. The last capacitor 222 is required to be a VVC because of voltage/energy characteristics of such components. VVCs are used since they result in a lower voltage source ripple and reduce battery consumption. Since the percentage of stored energy available from the VVC 222 is increased, the amount of battery consumption is decreased. The use of the VVC 222 minimizes ripple by its ability to produce more of its stored energy without sustaining a significant voltage drop. This increased energy delivered on available to the load without sustaining a significant voltage drop is due to the capacitance variation as the terminal voltage varies. It is noted that although the three capacitors 204, 212, and 218 need not be VVC's such component may be used to further improve the performance of the circuit 200. This improvement comes about since the percentage of stored energy available from each capacitor 204, 212, and 218) is increased, the amount of battery consumption is decreased. The use of VVC's can result in small capacitance value (smaller percentage circuit area) or reduced voltage variation (ripple).

The operation of the circuit 200 will be better understood by referring to the characteristics and operation of VVCs. A voltage variable capacitor (VVC) is a variable impedance device which exhibits a very large variation in capacitance versus voltage. Capacitance variation in the order of 50 to 1 can be exhibited in a VVC from the low to high bias voltage settings. Due to the physical construction of a VVC this electrical property is achieved with no appreciable DC current drain. The fabrication and operation of VVCs will be discussed later in association with FIG. 3.

Figure 4:
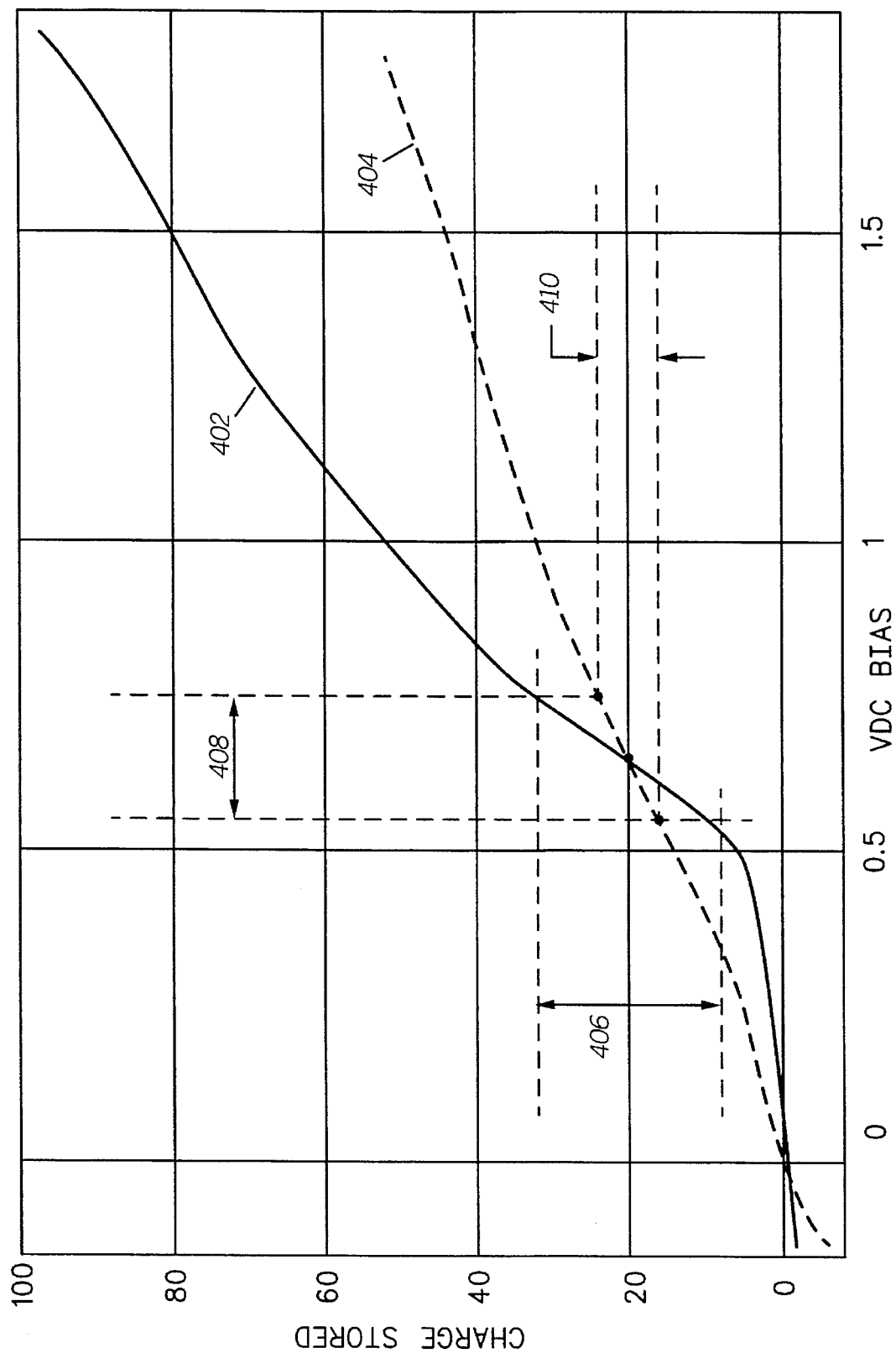
FIG. 4 shows graphs of the charge versus voltage performance of a fixed value capacitor and a voltage variable capacitor in accordance with the present invention.

A voltage variable capacitor (VVC) can be made to have an increase of charge versus voltage as shown in FIG. 4. The type of doping material and doping profile defines the characteristic behavior of the VVC. To illustrate this point, a VVC as described in Cornett et al. may be doped with N type or P type semiconductor material on either of two electrodes and depending upon which electrode is doped two distinct capacitance versus voltage relations may be defined. Thus, a VVC may be made to have a similar, yet steeper, capacitance versus voltage relationship as a fixed value capacitor.

The VVC possesses the required capacitance/voltage relationship to provide a greater percentage of the stored energy available to a load with a reduced voltage variation. FIG. 4 is a plot of a VVC (402) and a fixed capacitor (404) stored charge versus terminal voltage. The slope of the VVC is defined by $$C = Q/V = m(V-VO) + CO$$

and the slope of the fixed value capacitor is defined by $$C = Q/V$$

As can be seen the slope of graph 402 is steeper than that of 404. Over a 20% voltage range (408) the VVC provides almost twice the energy (406) available from a fixed value capacitor (410). To achieve this same voltage/energy available as the VVC the fixed capacitor value would have to be doubled. The improved voltage/energy available to the load relation of a VVC can be utilized in an energy transfer or a voltage source function. In applicable circuit functions, the benefit would be a reduced capacitance value (less integrated circuit area) or a reduced voltage variation (ripple). The factor of two times improvement can be realized with an increase in the dc/dv (capacitance to voltage) relation of the VVC component. The change in capacitance as a function of the voltage or slope of the graph in FIG. 4 is a function of the doped density. As the doped density decreases, the charge depletion region increases in thickness for the same terminal voltage. This increased depletion region is an increase in the dielectric thickness between the electrodes of the device and a decrease in capacitance.

Figure 3:
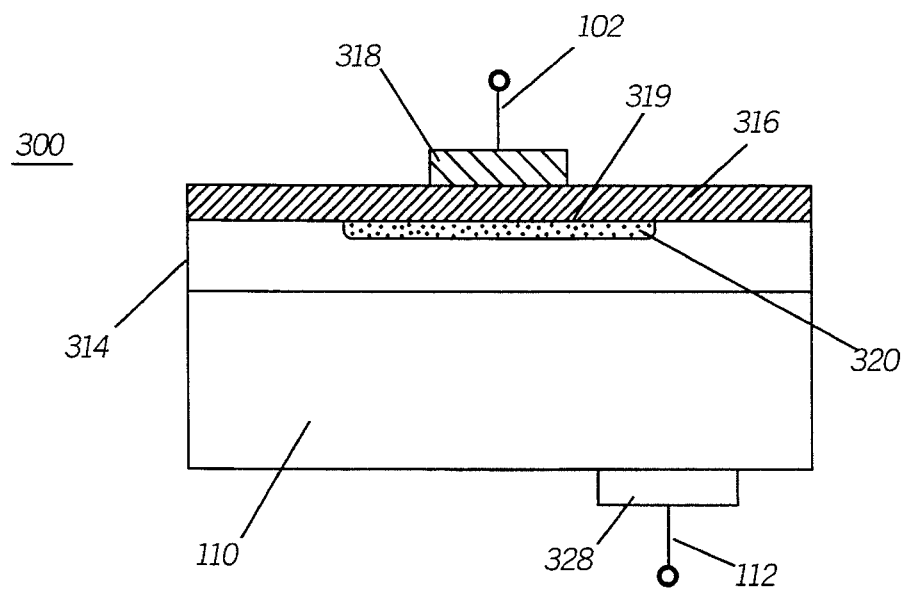
FIG. 3 show a cross sectional view of a voltage variable capacitor in accordance with the present invention.

Referring now to FIG. 3, there is shown a cross-sectional view of a VVC 300 in accordance with the present invention. The construction of the VVC 300 is presented here as a model for those (204,212, 218 222) used in the energy supplying device 200. The VVC 300 has two control lines, 102 and 112. An appropriate voltage applied to these control lines 102 and 112 is used to tune the VVC 300. The polarity of this voltage depends on the material used to construct the VVC 300. The VVC 300 is formed on the semiconductor substrate 110 having a surface layer 314 being less heavily doped than the substrate 110. The surface layer 314, being less heavily doped, has a higher resistivity than the semiconductor and serves as an area for a depletion layer to form. An insulator layer 316 is applied over the surface layer 314. At least one metal plate 318 is formed on the insulator layer 316. The metal plate 318 provides the external contact to the reactance component of the VVC 300 via a contact pin 102. More metal plates along with contacts may be formed on the insulator layer 316 to provide further control over the distributed capacitance of the VVC 300.

The polarity of the semiconductive material used in the fabrication of layers 110 and 314 determines the voltage polarities that will have to be applied to the control lines of the VVC. In other words, the polarity of the voltage potential applied to the control lines of devices 100 and 500 depends on the polarity of the semiconductive material used for layers 110 and 314.

The insulator layer 316 is preferably Zirconium Titanate ($ZrTiO_4$) applied in a thickness from 300 Angstroms to 1000 Angstroms, but thicknesses from 100 Angstroms to 2 microns have been found to be suitable. The material employed as the dielectric or insulating layer should have a dielectric constant much greater than that of the semiconductor. Examples of suitable materials that may be used for this purpose are to be found in TABLE 1 below:

TABLE 1

| tantalum pentoxide | $Ta_2O_5$ |
|---|---|
| niobium pentoxide | $Nb_2O_5$ |
| zirconium oxide | $ZrO_2$ |
| titanium dioxide | $TiO_2$ |
| zirconium titanate | $ZrTiO_4$ |
| strontium titanate | $SrTiO_3$ |
| barium titanate | $BaTiO_3$ |
| lead titanate | $PbTiO_3$ |
| barium tetratitanate | $Ba_2Ti_9O_{20}$ |
| barium neodymium titanate | $BaNd_2Ti_5O_{14}$ |
| lead—zirconium titanate | $Pb(Zr,Ti)O_3$ |
| lead—lanthanum zirconium titanate | $(Pb,La)(Zr,Ti)O_3$ |
| lithium niobate | $LiNbO_3$ |
| strontium—barium niobate | $(Sr,Ba)Nb_2O_6$ |

Oxides of additional elements such as molybdenum, tungsten and vanadium may also be expected to be useful, either alone or in combination with other elements.

When an appropriate reverse bias is applied between the metal electrodes 318 and 328, mobile minority charge carriers are attracted to a semiconductor insulator interface 319, forming a space-charge or depletion layer 320, which extends for some distance into the semiconductor 314. This depletion layer 320 behaves as a variable width capacitor which is electrically in series with the capacitor formed by the insulator layer 316. These two series capacitors serve to create a net capacitance effect that is affected by the changes of each individual capacitor. The electrode bias voltage controls the width of the depletion layer 320 from zero at the accumulation threshold to a minimum thickness at the inversion threshold and thereby varies the total capacitance of the device. The insulator layer 316 serves to provide the spacing between the top electrode 318 and the depletion layer 320. The depletion layer 320 is a transient layer formed when the bias voltage is applied to the capacitor through input contacts 102 and 112. The depletion layer 320, hence the distributed capacitance, may be reduced or disappear when the applied voltage field is varied or removed. Although shown in the drawing as a distinct feature, the depletion layer 320 should not be regarded as a permanent mechanical feature of the WC 300. The. operation theory described herein is similar to that found in operation of metal-oxide-semiconductor capacitors.

At the inversion threshold voltage, enough charge carriers have been attracted to the semiconductor interface such that an inversion layer is formed. Increasing the voltage bias increases the width of the inversion layer, until the layer reaches a maximum width, beyond which the depletion layer cannot be substantially increased by increasing electrode bias voltage. The maximum depletion width is determined by the concentration of the impurity dopant near the semiconductor surface onto which the insulator layer 316 has been deposited. Dopants such as phosphorous, antimony, boron and arsenic will be recognized by those skilled in the art to be useful with silicon substrates. Other semiconductor substrates, such as gallium arsenide may also be utilized to form a VVC in accordance with the invention.

The lower the doping, the larger the maximum depletion layer thickness, and thus, the lower minimum capacitance which can be achieved. The thickness of a less heavily doped surface layer may be chosen to be equal to or slightly greater than this maximum depletion width in order to minimize the series resistance of the device while maximizing the capacitance change. In the preferred embodiment, the doping characteristics are chosen to achieve nominal operation corresponding with the desired nominal operation and a slope or doping density to provide the available energy over the terminal voltage range of operation.

Formation of an improved voltage tunable capacitor network is highly dependent upon the choice of the material comprising the insulator layer 316. By choosing a material with a much larger relative dielectric constant than the semiconductor depletion layer 320, a larger ratio of maximum-to-minimum distributed capacitance will be obtained. The larger the insulator's dielectric constant, the larger the capacitance ratio in capacitance per unit area will be for a given insulator thickness.

Many materials with very high dielectric constants have ferroelectric properties which are not desirable for high frequency devices. The polarization for a ferroelectric material has a hysteresis loop, or memory, whereby a residual polarization remains after an applied bias voltage has been removed. Thus, a residual depletion layer would also remain and thereby limit the capacitance ratio which may be obtained. These materials would be best utilized in lower frequency applications.

A low-loss, non-ferroelectric insulator layer is required for high frequency applications, specifically those for use in radio transmitting and receiving, and especially for tunable high-Q filters. Zirconium Titanate ($ZrTiO_4$) is one suitable non-ferroelectric material with a high relative dielectric constant ($K_r$ is approximately equal to 40) and low dielectric loss. By comparison, the relative dielectric constant of silicon dioxide (used in conventional MOS capacitors) is 8.9. The dielectric constant of the depletion layer in silicon is 11.7 and the dielectric constant of the depletion layer in germanium is 15.7. It can be easily seen that the dielectric constant of the zirconium titanate and the aforementioned materials in Table 1 is much larger than that of silicon dioxide. Therefore, an improved capacitor having higher capacitance ratio can be fabricated. Thin films of zirconium titanate can be formed by any of several techniques, including but not necessarily limited to, sputtering, evaporation, chemical vapor deposition, ion beam or plasma enhanced processes, sol-gel, and other solution chemistry processes. The presentation of this view is meant only to enhance the understanding of the layers involved in the construction of the VVC 300. It is not in any fashion meant to imply, directly or otherwise, a limitation on the present invention.

Figure 5:
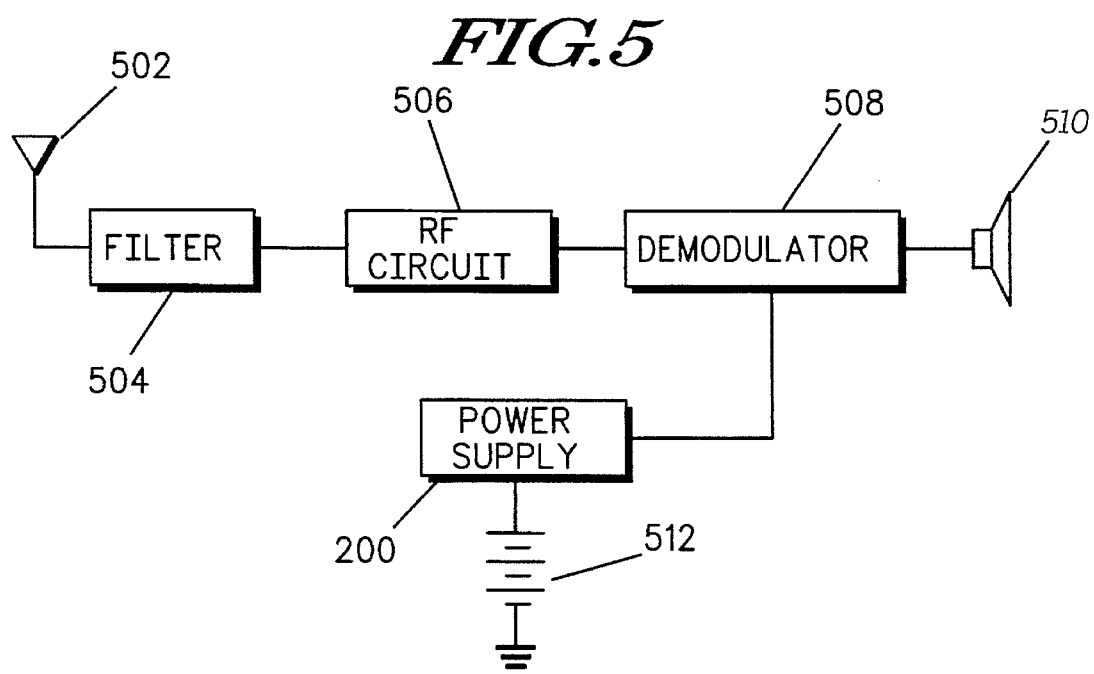
FIG. 5 shows a radio in accordance with the present invention.

Referring to FIG. 5, a block diagram of a communication device 500 is shown. The device 500 includes an antenna 502 where radio frequency signals are received. The signals are coupled to a filter 504 followed by RF circuits 506. The RF circuits 506 comprises the remaining RF components of the device 500. The radio frequency signals received at the block 506 are coupled to the demodulator 508 which demodulates the carrier to produce the information signal. This information signal is coupled to a speaker 510. A battery 512 provides supply voltage to the components of the radio 500 including the power supply 200. The power supply 200 converts the supply of the battery voltage and submits a different supply to the demodulator 508. In the preferred embodiment, the battery is a 7.5 volt source and the power supply converts that voltage to a regulated 5 volts DC and this is converted up to 20 VDC. The use of the power supply 200 eliminates the need for a second battery. The power supply 200 includes a VVC as described earlier. With this VVC the conversion of energy is conducted at high efficiency with minimum ripple. It is noted that in the description of the above embodiment the voltage drops due to diodes 210, 214, and 220 have been ignored in order to simplify the calculation of voltages.

In summary, a VVC is used in a power supply conditioning circuit to provide for efficient voltage conversion with minimum ripple. By altering the doping of the VVC the energy to voltage graph of the VVC is altered such that most of the stored energy is delivered at a substantially constant voltage. An additional benefit of this scheme is that the ripple is minimized for a given capacitance valve. For the same value capacitance and the same amount of energy drawn from the capacitor, the VVC will have a lower terminal voltage variation. The use of the VVC 300 significantly reduces the size of the power supply since the capacitance to volume ratio of the VVC is much higher than other fixed value capacitors implemented with a similar IC process. The electrical requirement that set the capacitance value is ripple voltage level. For equivalent ripple requirements a smaller value VVC is needed versus a fixed capacitor. Therefore, the overall size of the radio 500 may be reduced with increasing capabilities, including higher output power. The higher output power is accomplished via the high DC voltage available via efficient power supply, such as 200.

What is claimed is:

1. An energy supplying device, comprising:

a load;

energy converter means for converting an input supply voltage to an output supply voltage and coupling the output supply voltage with minimum ripple to the load; and a Voltage Variable Capacitor (VVC) for coupling the load to the energy converter means for storing the output supply voltage, the VVC is adapted to provide a significant amount of energy with insignificant variations in the output supply voltage level in order to minimize the ripple on the output supply voltage as it is supplied to the load.

2. The energy supplying device of claim 1, wherein the VVC includes:

a semiconductor having a first and a second layer each having a dielectric constant, the second layer formed of semiconductive material of a higher resistivity than the first layer;

a depletion layer formed in the second layer;

an insulating layer formed on the second layer, said insulating layer being a metal oxide having a dielectric constant greater than the dielectric constant of the semiconductor;

and a conductive electrode formed on the insulating layer.

3. The energy supplying device of claim 2, wherein the insulating layer has a dielectric constant greater than 16.

4. The energy supplying device of claim 2, wherein the insulating layer is a low-loss, non-ferroelectric insulator.

5. The energy supplying device of claim 2, wherein the dielectric constant of the insulating layer is greater than the dielectric constant of the second layer of semiconductive material.

6. The energy supplying device of claim 2, wherein the insulating layer is formed via a metal oxide wherein the metal comprises at least first and second components selected from the group consisting of barium, lead, lithium, molybdenum, neodymium, niobium, strontium, tantalum, titanium, tungsten, vanadium, and zirconium.

7. The energy supplying device of claim 1, wherein the VVC comprises a Zirconium Titanate integrated capacitor.

8. A Direct Current (DC) to DC converter, comprising:

an input voltage for producing an energy;

an intermediate storage device for temporarily storing the energy;

a converter for converting the energy to an output voltage; and an output storage device for storing the output voltage and delivering an output energy at variable rates while substantially maintaining the output voltage in order to minimize ripple.

9. The DC to DC converter of claim 8, wherein the output storage device includes a capacitor capable of delivering substantial energy with minimal changes in its output voltage.

10. The DC to DC converter of claim 9, wherein the capacitor includes a VVC.

11. The DC to DC converter of claim 10, wherein the VVC includes:

a semiconductor having a first and a second layer each having a dielectric constant, the second layer formed of semiconductive material of a higher resistivity than the first layer;

a depletion layer formed in the second layer; an insulating layer formed on the second layer, said insulating layer being a metal oxide having a dielectric constant greater than the dielectric constant of the semiconductor; and a conductive electrode formed on the insulating layer.

12. A radio communication device, comprising:

a receiver for receiving a radio frequency signal;

a power supply for supplying power with minimum ripple to the receiver and comprising:

energy converter means for converting an input supply voltage to an output supply voltage and coupling the output supply voltage to the receiver; and an energy storage device coupling the receiver to the energy converter means for storing the output supply voltage, the energy storage device is adapted to provide a significant amount of energy with insignificant variations in the output supply voltage level in order to minimize the level of ripple on the output supply voltage as it is supplied to the receiver.

13. The radio communication device of claim 12, wherein the energy storage device includes a VVC.

14. The radio communication device of claim 13, wherein the VVC includes:

a semiconductor having a first and a second layer each having a dielectric constant, the second layer formed of semiconductive material of a higher resistivity than the first layer;

a depletion layer formed in the second layer;

an insulating layer formed on the second layer, said insulating layer being a metal oxide having a dielectric constant greater than the dielectric constant of the semiconductor; and a conductive electrode formed on the insulating layer.

* * * * *